United States Patent [19]

Cheung

[11] Patent Number: 6,056,864
[45] Date of Patent: May 2, 2000

[54] ELECTROPOLISHING COPPER FILM TO ENHANCE CMP THROUGHPUT

[75] Inventor: Robin W. Cheung, Cupertino, Calif.

[73] Assignee: Advanced Micro Devices, Inc., Sunnyvale, Calif.

[21] Appl. No.: 09/170,220

[22] Filed: Oct. 13, 1998

[51] Int. Cl.[7] .............................. C25D 5/52; C25D 5/48; C23C 16/00; H01L 21/20; H01L 21/302
[52] U.S. Cl. .................. 205/222; 205/157; 205/223; 427/250; 427/355; 427/331; 438/584; 438/692; 438/697; 438/758; 438/618
[58] Field of Search .................... 205/157, 222, 205/223; 427/250, 355, 331; 438/618, 692, 694, 758, 759, 697

[56] References Cited

U.S. PATENT DOCUMENTS

| | | | |
|---|---|---|---|
| 4,944,836 | 7/1990 | Beyer et al. | 156/645 |
| 5,091,339 | 2/1992 | Carey | 437/187 |
| 5,173,442 | 12/1992 | Carey | 216/18 |
| 5,219,787 | 6/1993 | Carey et al. | 438/637 |
| 5,354,712 | 10/1994 | Ho et al. | 437/195 |
| 5,691,571 | 11/1997 | Hirose et al. | 257/751 |
| 5,723,387 | 3/1998 | Chen | 438/692 |
| 5,736,457 | 4/1998 | Zhao | 438/624 |
| 5,811,917 | 9/1998 | Sekinger et al. | 313/336 |
| 5,899,738 | 5/1999 | Wu et al. | 438/618 |
| 5,955,178 | 9/1999 | Orita et al. | 428/210 |
| 5,981,879 | 11/1999 | Dimitrakopoulos et al. | 257/40 |

FOREIGN PATENT DOCUMENTS 1723209 3/1992 U.S.S.R. .

*Primary Examiner*—Kathryn Gorgos
*Assistant Examiner*—Edna Wong

[57] ABSTRACT

In-laid metal, e.g., copper or copper alloy, contacts and conductive routing patterns are formed in recesses in the surface of a substrate by a damascene-type process, comprising depositing a layer of an electrically conductive material filling the recesses and covering the substrate surface, reducing the thickness of the layer by a process providing a faster rate of layer removal than that obtained by chemical-mechanical polishing (CMP), and subjecting the remaining layer thickness to CMP processing to (a) substantially remove the remaining layer thickness and (b) render the exposed upper surface of the material filling the recesses substantially coplanar with the substrate surface, whereby increased manufacturing throughput, greater planarity, and reduced defects are obtained.

17 Claims, 1 Drawing Sheet

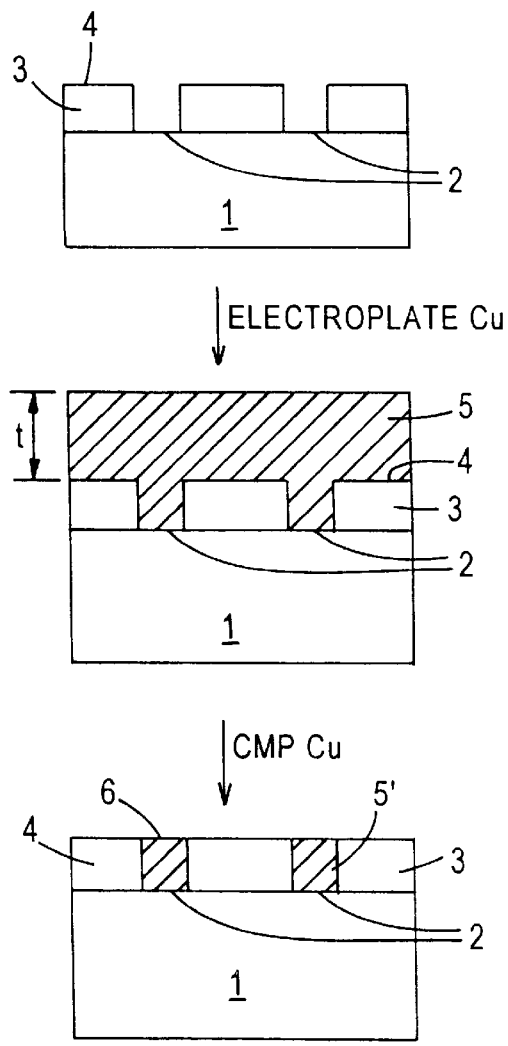
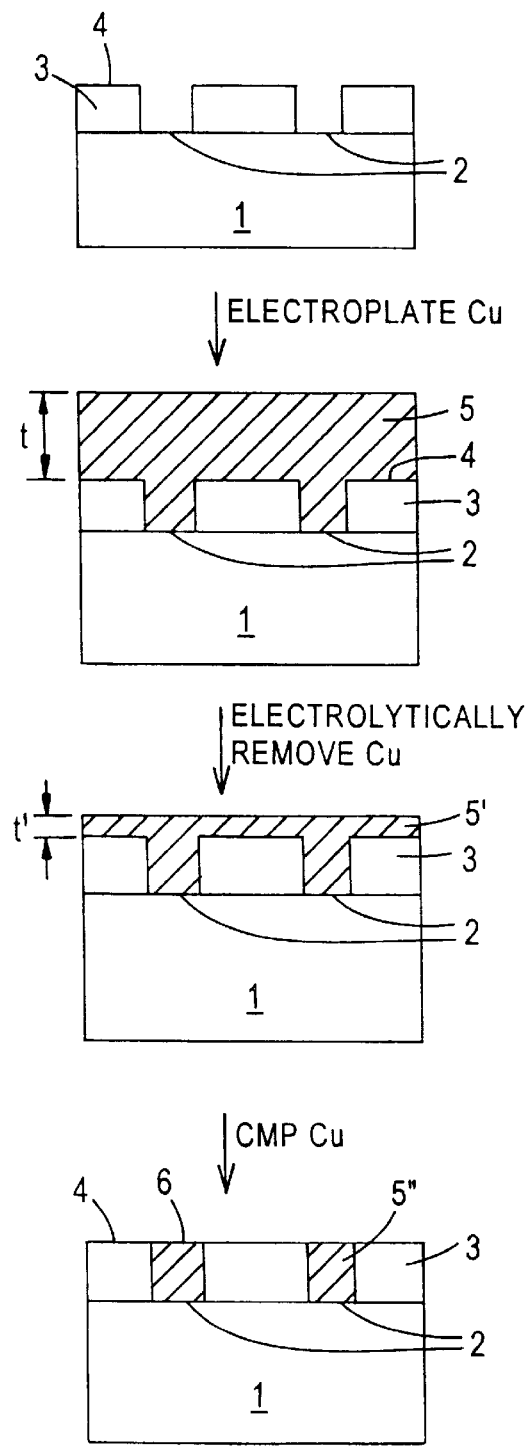

ELECTROPOLISHING COPPER FILM TO ENHANCE CMP THROUGHPUT

FIELD OF THE INVENTION

The present invention relates to a method of forming a layer of a metallic material filling at least one recessed area formed in the surface of a substrate, wherein the exposed upper surface of the layer is substantially coplanar with the substrate surface. More particularly, the invention relates to a method for "back-end" metallization of semiconductor devices which provides enhanced chemical-mechanical polishing (CMP) throughput and is compatible with existing manufacturing process methodology.

BACKGROUND OF THE INVENTION

This invention relates to metallization processes of particular utility in integrated semiconductor device and circuit board manufacture, which processes employ "damascene" (or in-laid) technology.

With reference to FIG. 1, schematically shown therein in cross-sectional view is a conventional damascene processing sequence for forming recessed metallization patterns ("back-end" contacts, vias, interconnections, etc.) in semiconductor devices formed in or on a semiconductor wafer substrate 1. In a first step, the desired conductor pattern is defined as a pattern of recesses 2 such as grooves, trenches, holes, etc. in a dielectric layer 3 formed over the semiconductor substrate, followed by a second step comprising deposition of a suitably conductive metal layer 5 filling the etched recesses 2. Typically, in order to ensure complete filling of the recesses, the metal layer 5 is deposited as a blanket layer of excess thickness t so as to overfill the recesses 2 and cover the upper surface 4 of the dielectric layer 3. Next, the entire excess thickness t of metal layer 5 over the surface of the dielectric layer 3 is removed using a CMP process, leaving metal portions 5' in the recesses with their upper (i.e., exposed) surfaces 6 substantially coplanar with the surface 4 of the dielectric layer. Thus this process, termed "damascene process", forms in-laid conductors in the dielectric layer while avoiding problems associated with types of other processes, e.g., metal etching and dielectric gap filling.

While such damascene processing can be performed with a variety of other types of substrates, e.g., printed circuit boards, with and/or without intervening dielectric layers, and with a number of metallization materials, including copper, aluminum, gold, silver, and their alloys, the parallel drives toward cost reduction and increased microminiaturization of semiconductor devices have provided an impetus for greater utilization of copper or copper alloy-based interconnection metallurgy, particularly in view of the attendant low resistivity and ability to reliably carry high current densities. However, the use of copper-based metallurgy has presented several problems, including the possibility of diffusion into the semiconductor substrate and poor adhesion to various dielectric materials, necessitating provision of an adhesion/barrier layer (e.g., chromium, tantalum, tantalum nitride) prior to depositing copper-based metallization.

Another problem associated with damascene processing of copper-based interconnection metallurgy arises from the use of electrolytic deposition of the copper material for filling vias, trenches, etc., followed by CMP to remove the excess copper. Electroplating has advantages, such as rapid deposition rates vis-a-vis "dry" processes, such as physical or chemical vapor deposition, and good compatibility with "wet" CMP processing which minimizes or eliminates difficult, expensive, and time consuming switchover from dry to wet process technology. However, electrolytic deposition of copper suffers from the drawback of ridge build-up over sharp corners of vias, grooves, and trenches. Thus, in conventional practices utilizing electrolytic deposition, a rather thick blanket layer 5 of copper, typically from about 0.5 u to about 1.5 u thick, is deposited over the recess-patterned surface to ensure complete filling (i.e., overfilling) of recesses 2 such as via holes, trenches, grooves, and other shapes of varying dimensions. Moreover, the resulting surface after overfilling is highly non-planar and, consequently, the layer thicknesses thereof may span the entire range of thicknesses given above.

Removal of such thick, non-planar blanket layers of copper in the subsequent CMP step for planarizing the interconnection metallization entails a number of drawbacks. First, CMP of copper or copper-based alloys is slow and expensive. Specifically, typical copper removal rates by CMP employing a conventional alumina-based slurry are on the order of about 2,000–3,000 angstroms/min. Consequently, removal of 0.5 u–1.5 u thick copper layers can require long processing times extending up to about 5 minutes, considerably longer than that desired for good manufacturing throughput and reduced expense. Second, in general, and in particular for copper-based layers subjected to CMP, removal of such thick as-deposited layers results in less uniform polished layers as are obtained when CMP is performed on thinner deposited layers. Third, such poor uniformity is generally accompanied by an increase in defects such as non-planarity ("dishing") and gouging ("erosion") between adjacent metallization lines.

Thus, there exists a need for a method for forming in-laid metallization patterns by a damascene technique which does not suffer from the problems of the prior art, i.e., reduced manufacturing throughput, increased cost, poor uniformity, and increased occurrence of defects such as "dishing" and "gouging". Specifically, there exists a need for an improved CMP-based metallization method for forming copper-based "back end" in-laid contacts and interconnection routing of transistors in integrated circuit semiconductor devices. Moreover, there exists a need for an improved CMP-based method for forming such contacts and interconnections which is fully compatible with conventional process flow and methodology in the manufacture of such integrated circuit semiconductor devices and other devices requiring in-laid metallization patterns.

DISCLOSURE OF THE INVENTION

An advantage of the present invention is a method of manufacturing a device with an in-laid metallization pattern at lower cost and with higher manufacturing throughput than with conventional process methodology.

Another advantage of the present invention is a method of manufacturing an integrated circuit device utilizing copper-based "back end" contacts and interconnections by a damascene process, with greater uniformity and planarity and reduced defects.

Still another advantage of the present invention is a method for forming in-laid contacts and metallization patterns by CMP at an increased speed, lower cost, and with greater planarity than conventional CMP-based processes.

A further advantage of the present invention is an improved method for forming in-laid contacts and metallization patterns by a damascene type CMP-based process which is fully compatible with existing process methodology.

A still further advantage of the present invention is a semiconductor device having an improved copper-based in-laid contact and/or interconnection routing pattern.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are achieved in part by a method of forming a layer of a metallic material filling at least one recessed area formed in a substrate surface and having an exposed upper surface substantially coplanar with the substrate surface, which method comprises the sequential steps of:

providing a substrate having a surface comprising at least one recessed area and at least one non-recessed area;

depositing a layer of an electrically conductive material over the surface, the layer overfilling the at least one recessed area and covering the at least one non-recessed area to a first thickness;

reducing the first thickness of the layer to a second thickness by a process having a faster rate of layer removal than chemical-mechanical polishing (CMP);

chemical-mechanical polishing the remaining thickness of the layer to (a) substantially remove the portions thereof covering the at least one non-recessed area of the substrate surface and (b) render the exposed upper surface of the portion filling the at least one recess substantially coplanar with the substrate surface, whereby increased manufacturing throughput, increased uniformity, and reduced defects are obtained as compared to removing the entire layer thickness by CMP.

In embodiments according to the invention, the substrate comprises a semiconductor having a dielectric layer formed thereon and the surface of the dielectric layer includes a plurality of spaced apart recesses for forming contacts and/or interconnection routing to at least one active device region, and the layer of electrically conductive material comprises a metal chosen from the group consisting of copper, aluminum, gold, silver, and alloys thereof. In preferred embodiments, the metal comprises copper or an alloy thereof, the depositing step comprises electroplating, the thickness reducing step comprises electrolytic etching or polishing, and the CMP processing step utilizes an alumina-based slurry.

According to another aspect of the invention, a method of manufacturing a semiconductor device comprises the sequential steps of:

providing a substrate comprising a semiconductor having formed thereon a dielectric layer comprising at least one recessed area and at least one non-recessed area;

depositing, by electroplating, a layer of copper or copper alloy over the surface, of the dielectric layer, the layer overfilling the at least one recessed area and covering the at least one non-recessed area to a first thickness of from about 0.5 u to about 1.5 u;

electrolytically reducing the first thickness of the layer to a second thickness less than about 5,000 angstroms at a faster rate of layer removal than CMP; and chemical-mechanical polishing the remaining second thickness of the layer to (a) substantially remove the portion(s) thereof covering the at least one non-recessed area of the substrate surface and (b) render the exposed upper surface of the portion(s) filling the at least one recess substantially coplanar with the substrate surface, whereby increased manufacturing throughput, increased uniformity, and reduced defects are obtained as compared to removing the entire layer thickness by CMP.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modifications in various obvious respects, all without departing from the present invention. Accordingly, the drawing and description are to be regarded as illustrative in nature, and not as limitative.

BRIEF DESCRIPTION OF THE DRAWINGS

FIG. 1 illustrates, in simplified cross-sectional schematic form, the steps for performing a damascene type metallization process according to conventional practices; and FIG. 2 illustrates, in simplified cross-sectional schematic form, the steps for performing a damascene type metallization process according to an embodiment of the present invention.

DESCRIPTION OF THE INVENTION

Referring now to FIG. 2, shown therein, for illustrative purposes only, is a portion of a semiconductor wafer substrate 1, typically of monocrystalline silicon containing at least one active device region therein or as part of an epitaxial layer formed thereon. It is to be understood that the principles of the present invention are equally applicable to a variety of other types of substrates, e.g., resin-containing laminates used for fabricating circuit boards and substrates for discrete electrical components such as thin film transistors, diodes, resistors, capacitors, etc.

As illustrated, a dielectric layer 3 having a pattern comprising a plurality of recesses 2 formed therein with a plurality of non-recessed surfaces 4 therebetween is present on the surface of semiconductor wafer substrate 1. The dielectric layer 3 and patterned plurality of recesses formed therein may be formed by any convenient method, such as photolithographic masking and etching, the details of which are conventional and, hence, not set forth herein in detail. Typical dimensions of recesses 2 include depths of from about 0.25 u to about 2.0 u and widths of from about 0.1 u to about 10 u, depending upon the specific shape and function of the particular metallization feature.

In the next process step, a layer 5 of metallization material, chosen from copper, aluminum, gold, silver, and alloys thereof, preferably of copper or copper-based alloy for the reasons previously given, is blanket deposited over the patterned dielectric layer 3 so as to fill the recesses 2 formed therein. As in the conventional process illustrated in FIG. 1, in order to ensure complete filling of the recesses 2 and provide adequate metallization conductivity, layer 5 is deposited in excess, i.e., so as to overfill the recesses 2 and cover the upper surfaces 4 of the non-recessed portions to a first thickness t.

Electrodeposition (i.e., electroplating) is a preferred technique for depositing metal blanket layer 5 by virtue of the high rates of deposition which are obtainable and its "wet" process nature which eliminates tedious, costly, and time consuming switchover from a "dry" deposition process such as chemical or physical vapor deposition. However, it is to be emphasized that any deposition technique, whether "dry" (e.g., chemical vapor deposition (CVD), metal-organic chemical vapor deposition (MOCVD), plasma enhanced chemical vapor deposition (PECVD), sputtering, ion plating, vacuum evaporation, etc.) or "wet" (e.g., electroplating, electroless plating, metal pasting or printing, dipping, coating, etc.) may be employed in the practice of the present invention, provided the deposition rate thereof is sufficiently rapid as to be compatible with the manufacturing throughput requirement. It should be understood that in depositing copper or a copper alloy, a conventional barrier layer is preliminarily deposited. Further, when electrodepositing copper or a copper alloy, a conventionally used layer can be deposited on the barrier layer to enhance nucleation of the electrodeposited layer.

In the case of copper electroplating of integrated circuit containing semiconductor substrates, satisfactory deposits with acceptable deposition rates can be obtained by utilizing any of several commercially available bath compositions and conventional, commercially available electroplating apparatuses. As a non-limiting example, with a typical bright copper bath (Enthone OMI Cu bath "M", available from Enthone OMI, Inc., located in New Haven, Conn.) comprising $CuSO_4$, $H_2SO_4$, and additives such as brighteners and leveling agents, operated at temperatures ranging from room temperature to about 50° C. and at cathodic current densities of from about 0.01 to about 2 amps/cm$^2$, deposition rates of about 1 u/min. and Cu blanket layer 5 first thicknesses t of from about 0.5 u to about 1.5 u are obtained.

In the next step according to this embodiment of the present invention, a portion of the first thickness t of metal blanket layer 5 is then removed by a method which provides a removal rate greater than that by conventional CMP, leaving a second thickness t'.

Embodiments of the present invention include electrolytic polishing or etching as preferred techniques for relatively rapid removal of a portion of the first thickness t of metal blanket layer 5 in order to provide a reduced, second layer thickness t', in view of its controllability by regulation of the electrochemical parameters, such as voltage and current density. Moreover, as is the case with blanket layer 5 deposition by electroplating, the "wet" nature of electrolytic etching or polishing eliminates any disadvantages arising from switchover from "wet" to "dry" processing. However, it is to be emphasized that any metal removal process, "wet" or "dry", including any conventional chemical, plasma, or ion etching process which provides a metal removal rate greater than CMP of that metal material can be employed in practicing embodiments of the invention. In addition, any convenient technique for controlling the du ration of etching or polishing for providing the desired residual blanket layer 5' second thickness t' may be employed, including, but not limited to use of a thickness detector, coulometric measurement, or a fixed time interval for layer removal.

In an embodiment of the present invention, the first thickness t of a copper blanket layer 5 of initial, as-deposited thickness of from about 0.5 u to about 1.5 u is reduced to a residual second thickness t' of about 5,000 angstroms at a removal rate of about 2u/min . by electrolytic treatment in an electrolyte comprising 70% orthophosphoric acid ($H_3PO_4$) at a temperature of from about room temperature to about 50° C. and an anodic current density of about 0.01 to about 2 amps/cm$^2$. Such a copper removal rate is severalfold greater than the 2,000–3,000 angstroms/min. removal rates obtained with conventional alumina slurry-based CMP, with an attendant reduction in processing time from at least 5 minutes for CMP to less than about 1 minute by the present invention.

In accordance with embodiments of the present invention, the residual blanket layer 5' second thickness t' is removed by CMP in a conventional manner, whereby in-laid metallization pattern 5" is obtained with the exposed upper surfaces 6 thereof substantially coplanar with the surface(s) 4 of dielectric layer 3. In an embodiment of the invention, the residual copper or copper-based blanket layer 5' of second thickness t' of about 5,000 angstroms is removed by conventional CMP utilizing an alumina-based slurry at a removal rate of from about 2,000 angstroms/min. to about 3,000 angstroms/min., i.e. in about a 2 minute interval.

A number of advantages are provided by the present invention, including but not limited to: increased manufacturing throughput and lower costs than conventional CMP-based damascene type metallization processing of thick blanket layers (e.g., as are obtained with electrodeposition), due to the removal of a significant portion of the blanket layer by a relatively rapid non-CMP process prior to planarization by relatively slow CMP processing; greater planarity of initially highly non-planar surfaces due to CMP processing of thinner blanket layers; and reduced incidence of defects such as "dishing" and "erosion" between adjacent metallization routing. In addition, the present invention is advantageously fully compatible with all aspects of conventional CMP process methodology.

In the previous descriptions, numerous specific details are set forth, such as particular materials, structures, reactants, processes, etc., in order to provide a thorough understanding of the present invention. However, it should be recognized that the present invention can be practiced without resorting to the details specifically set forth. For example, the present invention is applicable to metallizing dual damascene openings as well as single damascene openings. In other instances, well-known processing structures and techniques have not been described in detail in order not to unnecessarily obscure the present invention.

Only the preferred embodiments of the present invention are shown and described herein. It is to be understood that the present invention is capable of changes or modifications within the scope of the inventive concept as expressed herein.

What is claimed is:

1. A method of forming a layer of an electrically conductive material filling at least one recessed area formed in a substrate surface and having an exposed upper surface substantially coplanar with said substrate surface, the method comprising the sequential steps of:
   (a) providing a substrate having a surface comprising at least one recessed area and at least one non-recessed area;
   (b) depositing a layer of an electrically conductive material over said surface, said layer overfilling the at least one recessed area and covering the at least one non-recessed area to a first thickness;
   (c) reducing the first thickness of said layer to a second thickness by a wet process having a faster rate of layer removal than chemical-mechanical polishing (CMP);
   (d) chemical-mechanical polishing the remaining second thickness of said layer to substantially remove the portions thereof covering the at least one non-recessed area of the substrate surface and render the exposed upper surface of the portion filling the at least one recess substantially coplanar with the substrate surface, whereby increased manufacturing throughput, increased uniformity, and reduced defects are obtained as compared to removing the entire layer thickness by CMP.

2. The method as in claim 1, wherein said substrate surface comprises a plurality of spaced apart recessed areas and non-recessed areas.

3. The method as in claim 2, wherein the substrate comprises a semiconductor having a dielectric layer thereon and comprising said surface, and said plurality of recesses formed in said surface comprise electrical contact areas to and/or interconnection routing of at least one active device region of said semiconductor.

4. The method as in claim 3, wherein the layer of electrically conductive material comprises a metal selected from the group consisting of copper, aluminum, gold, silver, and alloys thereof.

5. The method as in claim 4, wherein the metal is copper or an alloy thereof.

6. The method as in claim 5, wherein the depositing step (b) comprises depositing by electroplating.

7. The method as in claim 5, wherein the depositing step (b) comprises depositing by metal-organic chemical vapor deposition (MOCVD).

8. The method as in claim 5, wherein the depositing step (b) comprises depositing said copper or copper alloy layer over the non-recessed areas to a first thickness of from about 0.5 u to about 1.5 u.

9. The method as in claim 8, wherein the reducing step (c) comprises reducing the first thickness of the copper or copper alloy layer covering the non-recessed areas to a second thickness less than about 5,000 angstroms.

10. The method as in claim 5, wherein the reducing step (c) comprises reducing the first thickness to the second thickness by wet chemical etching or electrolytic etching.

11. The method as in claim 10, wherein the reducing step (c) comprises wet chemical etching.

12. The method as in claim 10, wherein the reducing step (c) comprises electrolytic etching.

13. The method as in claim 12, wherein the reducing step (c) comprises electrolytic etching in an orthophosphoric acid-containing electrolyte bath.

14. The method as in claim 5, wherein step (d) comprises chemical-mechanical polishing (CMP) with an alumina-based slurry.

15. A method of manufacturing a semiconductor device, the method comprising the sequential steps of:

providing a substrate comprising a semiconductor having thereon a dielectric layer with a surface comprising at least one recessed area and at least one non-recessed area;

electrodepositing a layer of copper or copper alloy over said surface to a first thickness, said layer overfilling the at least one recessed area and covering the at least one non-recessed area;

electrolytically reducing the first thickness of said layer to a second thickness; and chemical-mechanical polishing (CMP) the remaining second thickness of said layer to (a) substantially remove the portions thereof covering the at least one non-recessed area of the substrate surface and (b) render the exposed upper surface of the portion filling the at least one recess substantially coplanar with the substrate surface.

16. The method as in claim 15, wherein the surface of said dielectric layer comprises a plurality of spaced apart recesses formed therein, said plurality of recesses serving as electrical contact areas to or interconnection routing of at least one active device region of said substrate.

17. The method as in claim 16, wherein the electrodepositing step comprises depositing said copper or copper alloy layer over the non-recessed areas to a first thickness of from about 0.5 u to about 1.5 u and the electrolytically reducing step comprises reducing the deposited copper or copper alloy layer to a second thickness less than about 5,000 angstroms.

* * * * *